United States Patent [19]

Vick

[11] Patent Number: 4,986,661
[45] Date of Patent: Jan. 22, 1991

[54] SOLID STATE FIBER OPTIC SEMICONDUCTOR RING LASER APPARATUS

[75] Inventor: Gerald L. Vick, Mt. Vernon, Iowa

[73] Assignee: Rockwell International Corporation, El Segundo, Calif.

[21] Appl. No.: 247,976

[22] Filed: Sep. 21, 1988

[51] Int. Cl.[5] ............................................. G01B 9/02
[52] U.S. Cl. ...................................... 356/350; 372/94
[58] Field of Search ................... 356/350; 372/38, 46, 372/50, 94, 108; 350/96.13, 96.14

[56] References Cited

U.S. PATENT DOCUMENTS

| 4,198,115 | 4/1980 | Kaminow | 372/108 |
| 4,405,236 | 9/1983 | Mitsuhashi et al. | 356/350 |
| 4,431,308 | 2/1984 | Mitsuhashi et al. | 372/94 |
| 4,799,229 | 1/1989 | Miyazawa et al. | 372/46 |

OTHER PUBLICATIONS

"High Quality Antireflection Coatings on Laser Facets by Sputtered Silicon Nitride", by G. Eisenstein and L. W. Stuiz.

"A 1.55 μm Semiconductor-Optical Fiber Ring Laser", by R. M. Jopson et al., p. 204.

Primary Examiner—Vincent P. McGraw
Assistant Examiner—S. A. Turner
Attorney, Agent, or Firm—Gregory G. Williams; M. Lee Murrah; H. Fredrick Hamann

[57] ABSTRACT

A high power solid state semiconductor fiber optic ring laser which includes an optical amplifier diode having its waveguide region oriented at an angle between Brewster's angle and 0° with respect to the normal to the diode cleavage planes together with antireflection coatings disposed on the diode cleavage planes. The optical amplifier diode being optically coupled with the ends of an optical fiber.

4 Claims, 1 Drawing Sheet

SOLID STATE FIBER OPTIC SEMICONDUCTOR RING LASER APPARATUS

BACKGROUND OF THE INVENTION

The present invention generally relates to lasers, and more particularly is concerned with fiber optic semiconductor ring lasers.

In recent years, the aviation industry has been involved in a seemingly never ending quest to enhance the performance of modern avionics. One particular area in which avionics engineers have expended much effort and achieved many successes, is in the substitution of completely electro-optical systems for the conventional mechanical systems of the past. A prime example of these efforts is in the area of inertial navigation systems.

Mechanical gyroscopes have been, for years, a central component to any inertial navigation system. Recently, the helium neon (He-Ne) ring laser gyroscope has replaced many of the mechanical gyros. However, these He-Ne ring laser gyros have disadvantages in cost and size, among others. With the recent advent of the global positioning system, which uses satellite communications to assist inertial navigation systems, the fiber optic ring laser gyroscopes are becoming more attractive.

Numerous ring lasers which incorporate optical fibers have been used in the past for several applications. One example of a ring laser which uses a fiber optic resonant ring is described in U.S. Pat. No. 4,405,236, entitled "Semiconductor Ring Laser Apparatus", which was issued on Sept. 20, 1983 to Mitsuhashi et al., which patent is incorporated herein by this reference.

While the Mitsuhashi apparatus is capable of producing a ring laser, it does have several disadvantages. A major problem with this approach is that it has a reduction in internal diode reflections, but only at the cost of the overall performance of the laser. The Mitsuhashi design utilizes a diode with its waveguide region being oriented at Brewster's Angle with respect to the normal to the diode cleavage plane. Also at this angle with respect to the cleavage plane is each end of the fiber optic ring. The use of Brewster's Angle was intended to reduce the reflections from within the diode and thereby allowing for the fiber ring to act as the resonant cavity. However, when Brewster's Angle is used, the overall power of the laser is often less than optimal.

Consequently, a need exists for the improvement in fiber optic ring lasers which reduce internal diode reflections, while still providing a high degree of power out of the ring laser.

SUMMARY OF THE INVENTION

It is an object of the present invention to provide a fiber optic resonant ring laser with reduced internal diode reflections.

It is a feature of the present invention to utilize an optical amplifier diode with antireflection coatings.

It is an advantage of the present invention to achieve a substantial reduction in the phase lock problems when ring lasers are used as gyroscopes.

It is another object of the present invention to improve the power of ring lasers having a fiber optic resonant ring.

It is another feature of the present invention to include an optical amplifier diode which has its waveguide region oriented at an angle between Brewster's Angle and 0 degrees with respect to the normal to the diode cleavage plane.

It is another advantage of the present invention to allow for the reduction of internal diode reflections without an unnecessary reduction in the power of the ring laser.

The present invention provides a fiber optic semiconductor ring laser that is designed to fulfill the aforementioned needs, satisfy the earlier propounded objects, include the above described features, and achieve the previously stated advantages. The invention is carried out in a "Brewster's Angle-less" approach, in the sense that the diode waveguide region and the fiber optics are not oriented at Brewster's Angle with respect to the diode cleavage planes or normals thereto. Instead, the waveguide region is oriented at an angle between Brewster's Angle and 0 degrees with respect to the normal to the diode cleavage planes. Furthermore, the cleavage planes of the diode are coated with an antireflective coating. This allows for the minimization of reflections within the diode, thereby, also minimizing any resonance in the diode.

Accordingly, the present invention includes a fiber optic ring laser which utilizes an optical amplifier diode having its waveguide region oriented at an angle between Brewster's Angle and 0 degrees, with respect to the normal to the diode cleavage plane, the diode further having antireflection coatings on the diode cleavage planes.

BRIEF DESCRIPTION OF THE DRAWINGS

The invention may be more fully understood by reading the following description of a preferred embodiment of the invention in conjunction with the appended drawings wherein.

DETAILED DESCRIPTION

Figure 1:
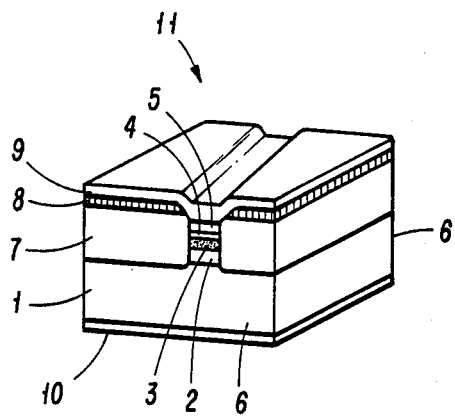
FIG. 1 is a schematic representation of an optical amplifier diode of the present invention, which is shown before any antireflection coatings are deposited on the diode.

Referring now to the drawings, and more particularly to FIG. 1, there is shown an optical amplifier diode, generally designated 11. Numeral 1 denotes a substrate, while numeral 2 denotes a lower clad layer. Also shown is a waveguide region 3, an active layer 4 and an upper clad layer 5. These layers 2, 3, 4, and 5 form a striped mesa portion formed to have an angle between Brewster's Angle and 0 degrees with respect to the normal to each cleavage plane 6. Numeral 7 denotes a burying layer, while numerals 8, 9 and 10 denote an insulation layer, an upper metallic layer electrode and a lower metallic layer electrode respectively.

The element as shown is manufactured by known processes, while the antireflection coating deposition on the cleavage planes (shown in FIG. 2) is also known generally and is mentioned in the following publication which is incorporated herein by this reference: "High quality antireflection coatings on laser facets by sputtered silicon nitride," written by G. Eisenstein, and L. W. Stulz in Applied Optics, Volume 23 No. 1, Jan. 1, 1984.

Figure 2:
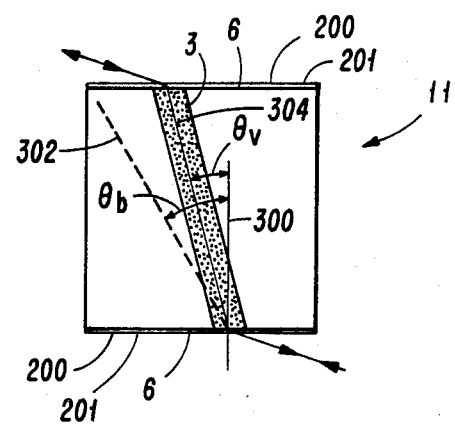
FIG. 2 is a schematic cross-sectional top plan representation of a preferred embodiment of the present invention which clearly shows the orientation of the waveguide region at an angle between Brewster's Angle and 0 degrees with respect to the normal to the diode cleavage plane, together with the antireflection coatings formed on the cleavage planes.

Now referring to FIG. 2 there is shown a schematic cross-sectional top plan view of a diode of the present invention. Line 300 represents the normal to the diode cleavage plane 6. $\theta_b$ represents the angle between line 300 and the intermittent line 302. $\theta_b$ is chosen to represent Brewster's Angle, for this particular diode. Throughout this description of the invention, it is intended that Brewster's Angle be determined by disregarding the presence of the coating 200, and calculating Brewster's Angle using the indices of refraction for the waveguide region 3 and the optical fiber 18 (shown in FIG. 3), or whatever medium is adjacent to the exterior edge 201 of the coating 200. $\theta_y$ represents the angle from line 304 to line 300 and is clearly shown to be less than Brewster's Angle but greater than 0 degrees.

While not wishing to be bound by theory, the following is included merely as a suggestion as to why the advantages of this invention occur. It is believed that the orientation of the waveguide region at Brewster's Angle with respect to the normal to the diode cleavage planes and the orientation of the optical fiber at Brewster's Angle with respect to the cleavage planes causes only polarized light to pass into the optical fiber. The reduction in the number of modes that are allowed to exist in the optical fiber will have a concomitant reduction in the overall modes that will resonate in the optical fiber ring, thereby reducing the overall intensity of the amplified light output of the ring laser.

Figure 3:
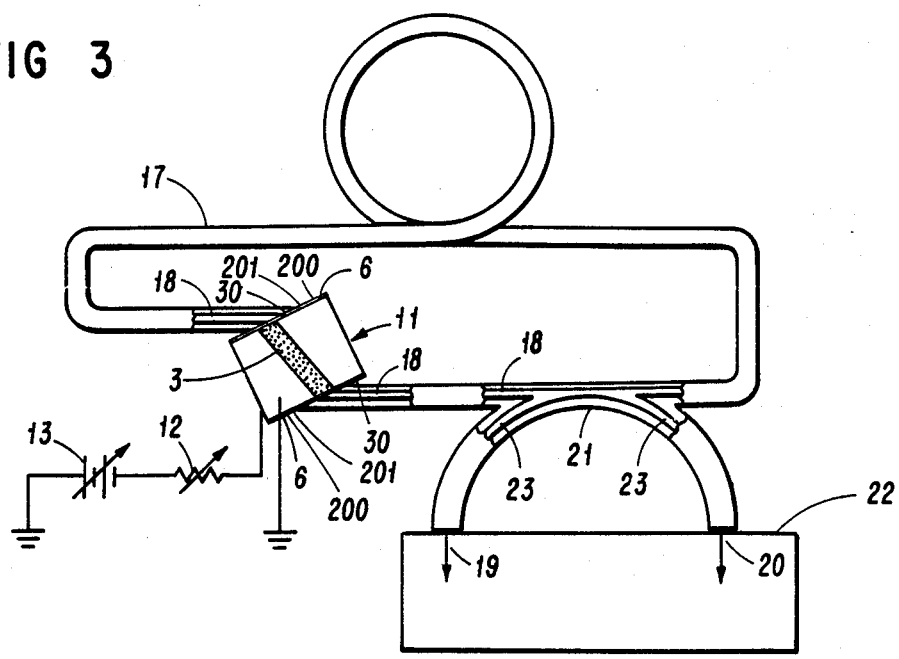
FIG. 3 is a schematic representation of a preferred embodiment of the ring laser of the present invention.

Now referring to FIG. 3, there is shown a gyroscope apparatus, having the optical amplifier diode 11, of FIGS. 1 and 2, together with the antireflection coatings 200 thereon. The resonant cavity for the ring laser is formed with fiber loop 17, with optical fiber 18 disposed therein, in conjunction with the diode 11. In a preferred embodiment, fiber loop 17 and optical fiber 18 may have first and second fiber ends 30, with each fiber having an end angle which is between Brewster's Angle and 0 degrees. The end angle is measured as a deviation from a perpendicular or flat end. If fiber loop 17 and optical fiber 18 have a circular cross-section, then the perpendicular end will have a circular shape, while the fiber ends 30, of the present invention would have an elliptical shape with increasing eccentricity corresponding to increasing end angle from 0 degrees toward Brewster's Angle. However, other fiber end configurations are possible, so long as the fiber end is shaped and positioned so that it is optically coupled with the diode.

Also shown are variable voltage source and variable resister 13 and 12 respectively, which together perform the function of controlling the optical amplifier diode 11. Fiber optic directional coupler 21 is utilized to connect read out device 22 with the fiber loop 17. Coupler 21 is coupled with loop 17 so that optical fiber 18 is split off, in part, from the loop 17 and coupled to readout optical fiber 23 which has a first read out end 19 and a second read out end 20. Readout optical fiber 23 is capable of transmitting two separate and oppositely directed light signals, one signal toward the first readout end 19 and the other light signal toward the second readout end 20, with both signals being input into readout device 22. Readout device 22 may be an optical detector or any device for measuring the rotation of the loop 17 by analyzing the frequency differences between the signals which are input from first readout end 19 and second readout end 20. The use of other known readout devices is also possible.

It is thought that the ring laser of the present invention and many of its attendant advantages will be understood from the forgoing description, and it will be apparent that various changes may be made in the form, construction, and the arrangement of the parts, without departing from the spirit and scope of the invention, or sacrificing all of their material advantages, the form described herein being merely preferred or exemplary embodiments thereof.

I claim:

1. A ring laser comprising;
   a. an optical fiber, having a first fiber end and a second fiber end;
   b. said first fiber end and said second fiber end each having an end angle less than Brewster's Angle;
   c. an optical amplifier diode having a first diode cleavage plane and a second diode cleavage plane;
   d. said diode having reflection reducing coatings disposed on its first diode cleavage plane and on its second diode cleavage plane; and
   e. said optical fiber being coupled with said diode, so that, the first fiber end is optically coupled to the first diode cleavage plane and the second fiber end is optically coupled to the second diode cleavage plane.

2. A ring laser of claim 1 wherein the optical amplifier diode has a waveguide region disposed between the first diode cleavage plane and the second diode cleavage plane, said waveguide region being oriented at an angle less than Brewster's Angle with respect to the normals to the diode cleavage planes.

3. A fiber optic ring laser gyroscope comprising:
   a. an optical fiber, having a first fiber end and a second fiber end, with each fiber end having an end angle less than Brewster's Angle;
   b. an optical amplifier diode having a first diode end and a second diode end;
   c. said diode having reflection reducing coatings disposed on its first diode end and on its second diode end;
   d. said optical fiber being optically coupled with said diode, so that, the first fiber end is optically coupled to the first diode end and the second fiber end is optically coupled to the second diode end;
   e. means for detecting light waves that may occur within said optical fiber; and
   f. means for comparing light waves which are detected by said means for detecting.

4. A gyroscope of claim 3 wherein the optical amplifier diode further comprises a waveguide region and a diode cleavage plane, said waveguide region being oriented at an angle between Brewster's Angle and 0 degrees with respect to the normal to the diode cleavage plane.

* * * * *